United States Patent [19]

Cheh

[11] Patent Number: 4,666,199
[45] Date of Patent: May 19, 1987

[54] CHIP CARRIER EXTRACTION TOOL

[75] Inventor: Ernest L. Cheh, Norwalk, Conn.

[73] Assignee: Burndy Corporation, Norwalk, Conn.

[21] Appl. No.: 894,818

[22] Filed: Aug. 8, 1986

[51] Int. Cl.$^4$ .................. H05K 13/04; A61B 17/04
[52] U.S. Cl. .................................. 294/106; 294/99.2
[58] Field of Search ............... 294/99.2, 106, 99.1, 294/16, 8.5, 11, 33; 24/542, 543, 544, 545, 546, 547, 561, 562, 563, 564; 29/747, 750, 758, 740, 764; 128/321, 334, 346

[56] References Cited

U.S. PATENT DOCUMENTS

| 4,506,669 | 3/1985 | Blake, III | 294/99.2 |
| 4,569,550 | 2/1986 | Harigane et al. | 294/106 |

OTHER PUBLICATIONS

Burndy Corp. brochure: "Burndy the Connector Selector" (5 pg.).
Photocopy, in silhoutte, of AMP Inc. Extraction Tool (1 pg.).
Photocopy, in silhoutte, of Microelectronics Supplies Inc. Extraction Tool (1 pg.).
Advert, Little Gripper Dip Extractor, Techni–Tool (1 pg.).
Catalog, SAMTEC, illust. pin grid array extractor (1 pg.).

Primary Examiner—James B. Marbert
Attorney, Agent, or Firm—Perman & Green

[57] ABSTRACT

A tool for extracting a microelectronic chip carrier from a receptacle to which it is connected. It includes left and right arms, each having coextensive members in the form of a substantially rigid tong and a flexible leg. Both arms are pivotally mounted at a common axis for relative movement. A distant end of each tong terminates at a chip carrier engaging hook and is slidably received in a channel formed in a tong support at a far end of the leg. Each leg has a bearing surface at its extreme end and a hinge member intermediate its ends and is bowed outwardly of its associated tong. With the bearing surface engaged on the receptacle, the arms are opened sufficiently wide that the hooks which are extended from the bearing surface when the tool assumes its relaxed condition, straddle the chip carrier. As the arms are squeezed together, lateral movement of the flexible leg members toward their associated tong members is effective to move the hooks, in a continuing sequence, first laterally toward and into engagement with the chip carrier, then longitudinally in a direction away from the receptacle until the chip carrier is dislodged from the receptacle.

14 Claims, 8 Drawing Figures

CHIP CARRIER EXTRACTION TOOL

BACKGROUND OF THE INVENTION

1. Field of the Invention

This invention relates to an improved tool for extracting a microelectronic chip carrier from a receptacle to which it is connected.

2. Description of the Prior Art

Mounting of a chip carrier onto an appropriate receptacle is a relatively straight forward procedure. It merely requires an operator to align the contacts of the chip carrier with those of the mating receptacle, then press firmly against the receptacle until it is fully seated. In the instance in which the chip carrier has a plurality of outwardly extending pins, these pins must be firmly aligned with socket holes in the receptacle before pressing firmly against the chip carrier. However, extracting the chip carrier, is not merely as simple a procedure for a number of reasons.

In the first instance, the chip carriers are small and generally difficult to grasp. Furthermore, if too much pressure is applied to the outer casing of the carrier, it can become cracked and thereby probably rendered useless. Additionally, chip carriers are often mounted on densely packed receptacles, printed circuit boards, for example, such that they are closely surrounded by other components. Then, too, if the chip carrier is not drawn outwardly in a careful manner such that a plane of the chip carrier remains generally parallel with that of the circuit board, the contacts can become bent and therefore misaligned, such that, following a subsequent insertion, they will not operate in an effective manner.

To effect extraction of a chip carrier from a receptacle without damage to either component, a number of tools have previously been devised. For example, Burndy Corporation, of Norwalk, Conn., presently manufactures and sells extraction tools referred to by catalog numbers QILE68EX-1 and QILE84EX-1. This design is of the screw type and requires a different size of extraction device for each different size of chip carrier. For example, in the instance of the first catalog number cited above, the tool is operable to extract 68 contact chip carriers while the latter design is effective to extract 84 contact tool carriers.

Another extraction tool also manufactured by Burndy Corporation is that known by catalog number QILE68EX-2. In this instance, the tool includes a base with a depending skirt to define an underneath recess. Centrally upstanding from the upper surface of the base is an integral thumb receiving post. A spring member with a pair of opposed tong receiving loops located to either side of the post passes slidably through a vertical slot in the post. Each loop is curved outwardly and downwardly and extends through holes adjacent opposite corners in the base and terminates at a hook for engaging a chip carrier. When the base is grasped and the spring members pushed downwardly, the chip carrier engaging hooks extend beyond the terminal rim of the pending skirt. Then holding the tool by the sides of the springs, the tool is placed over the socket supporting a chip carrier and the hooks are appropriately positioned to straddle the chip carrier. Thereupon, the thumb receiving post is pushed downwardly toward the socket which serves to extend the tool skirt over the side of the socket and the socket into the recess defined by the skirt. While maintaining downward pressure on the knob, the operator then pulls the two loops of the spring member upwardly to extract the chip carrier from its socket. The tool is then lifted from the socket carrying with it the extracted chip carrier. Thereupon, the chip carrier is released from the tool by setting the tool on a soft surface and pushing down on the spring.

Another known tool is manufactured and sold by AMP Inc. of Harrisburg, PA, known by catalog number 821566-1, also known as AMP "68", which is capable of extracting a carrier chip with 68 connectors. This too, is capable of extracting only one size of chip carrier, for example, a carrier whose chip has 68 contacts. As with the other constructions, this tool also has a pair of spaced apart hooks extending from the main body of the tool. The hooks are operated by opposed handles which pivot on spaced apart axes. The handles have matingly engaging arcuate surfaces which operate a suitable cam and follow mechanism to cause the hooks to compress on the sides of the chip carrier; then, when the operator continues to squeeze the handles together, the hooks engage the undersurface of the chip carrier and draw it away from the receptacle in which it had been positioned.

Still another extraction tool which has previously been used in a tweezers type tool which is manufactured by Microelectronics Supplies Inc., of Danbury, Conn. and identified by catalog number QILE--EX-3. In this instance, inwardly directed hooks at the extreme ends of the device straddle the chip carrier and are moved by the operator to engage both the sides and the undersurface of the chip carrier. With the tool squeezed against the chip carrier, the operator pulls in a direction away from the receptacle on which the chip carrier is mounted to thereby extract the chip carrier from the receptacle.

Still another extractor tool is manfactured by Techni-Tool of Plymouth Meeting, Pa. under the trademark "LITTLE GRIPPER". This latter tool is a DIP (i.e. "dual in-line pin") extraction tool which has opposed rows of teeth which can be extended from a handle portion to engage the carrier unit when the teeth are aligned with spaces between the DIP leads. The extraction device is then locked onto the DIP and, by using a T-bar fixed to a slide member which extends through the housing and is integral with the tong member, is then raised to thereby draw the connector off the receptacle to which it was previously mounted.

Yet another extractor tool known to the Inventor is manufactured by SAMTEC of New Albany, Ind. This tool is cam actuated and acts on all four sides of a pin grid array at one time.

It was with knowledge of the current state-of-the-art as represented by the extraction tools just described that the present invention was conceived and has now been reduced to practice.

SUMMARY OF THE INVENTION

The present invention is directed toward a tool for extracting a microelectronic chip carrier from a receptacle to which it is connected. It includes right and left arms, each having coextensive members in the form of a substantially rigid tong and a flexible leg. The arms are pivotally mounted at a common axis for relative movement. A distant end of each tong terminates at a chip carrier engaging hook and is slideably received in a channel formed in a tong support for a far end of the leg. Each leg has a bearing surface at its extreme end and a hinge member inermediate its ends and is bowed outwardly of its associated tong. With the bearing surface engaged on the receptacle, the arms are opened sufficiently wide that the hooks which are extended from the bearing surface when the tool assumes its relaxed position, straddle the chip carrier. As the arms are squeezed together, lateral movement of the leg members toward their associated tong members effective to move the hooks, in a continuing sequence, laterally toward and into engagement with the chip carrier, then longitudinally in a direction away from the receptacle until the chip carrier is dislodged from the receptacle.

The invention is of a simple construction such that it can be inexpensively manufactured and maintained. Additionally, the present invention is of a generally universal design which enables it to be applicable for the removal of a large variety of sizes of chip carriers. The tool of the invention is also substantially foolproof in its operation. To this end, it only lightly engages the sides of the carrier chip and applies virtually all of its forces via the opposed hook members to draw the chip carrier away from the receptacle by gripping it from its underside. Opposed wing members which extend laterally outwardly from each tong support lightly engage the chip carrier whenever it tends to rotate about an axis defined by the opposed hooks as it is being drawn away from the receptacle. The tool assures a consistent operation each time it is used without regard to the particular operator of the tool. At the outset of a removal operation, it is inserted so that the hook members straddle the chip carrier. Its opposed arms are squeezed together, and, in a continuous operation, the hook engages the undersurface of the chip carrier then, with the application of a consistent force, draws the chip carrier away from its mating receptacle in a continuous operation until the chip carrie has been dislodged.

Other and further features, objects, advantages, and benefits of the invention will become apparent from the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention and, together with the description, serve to explain the principles of the invention in general terms. Like numerals refer to like parts throughout the disclosure.

DETAILED DESCRIPTION OF THE PREFERRED EMBODIMENT

Figure 1:
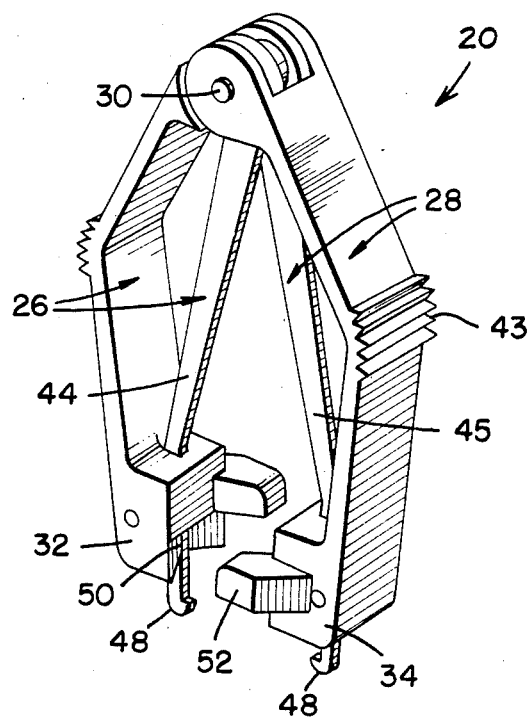
FIG. 1 is a perspective view of a carrier chip extraction tool embodying the invention.
Figure 2:
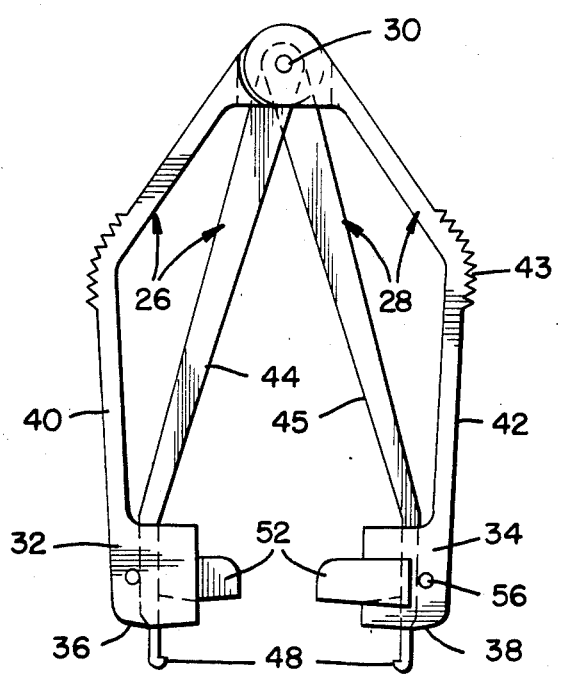
FIG. 2 is a front elevation view of the extraction tool illustrated in FIG. 1.
Figure 3:
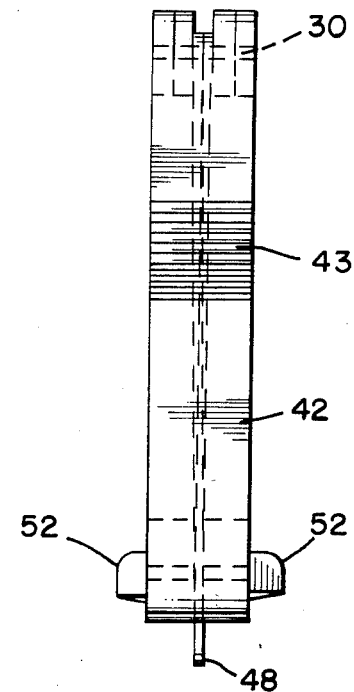
FIG. 3 is a side elevation view of the extraction tool illustrated in FIGS. 1 and 2.
Figure 4A:
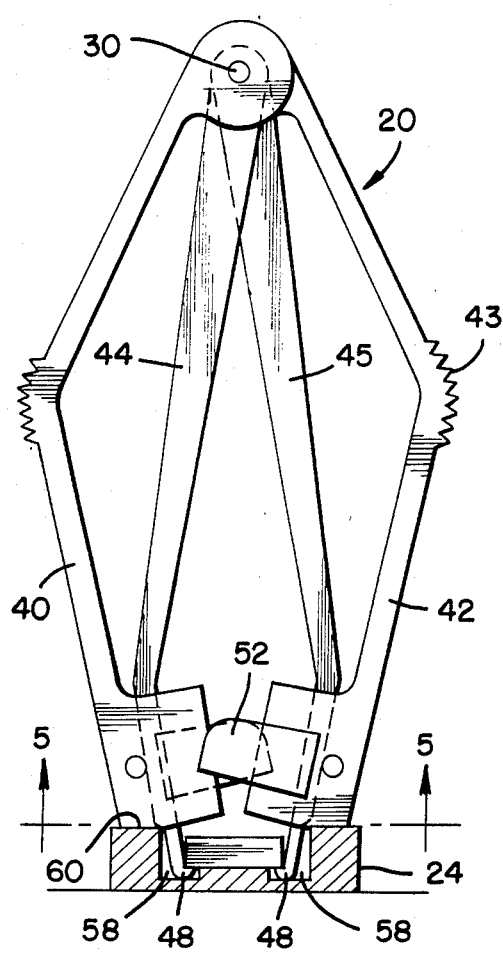
FIGS. 4a and 4b are detail side elevation views, certain parts being cut away and in section, illustrating, respectively, the relative positioning of the elements of the extraction tool immediately before, and immediately after, the extraction operation.
Figure 4B:
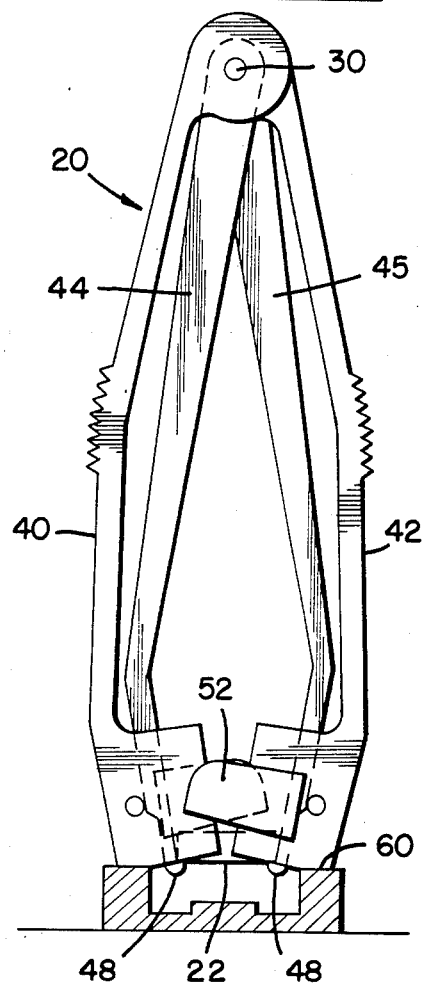
Figure 6:
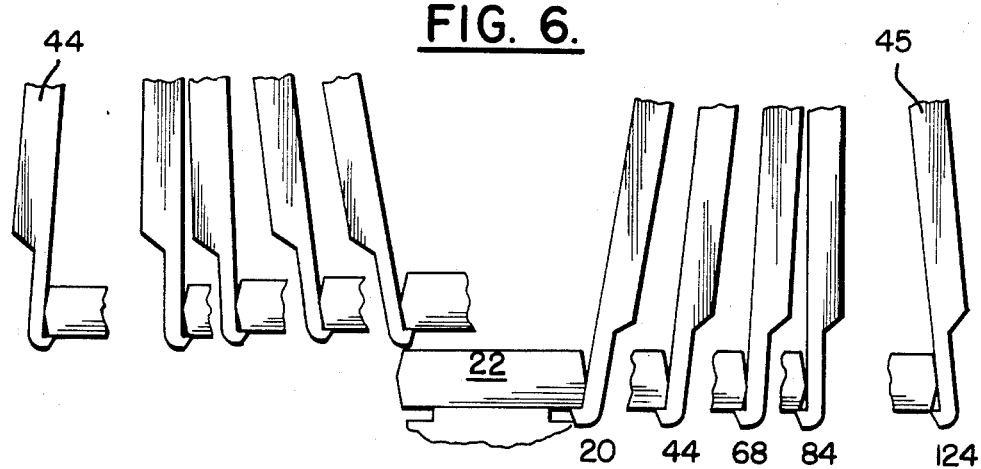
FIG. 6 is a detail side elevation view illustrating various positions of the extraction tool and thereby showing the manner in which the extraction tool can be operated to accommodate a wide variety of sizes of carriers.
Figure 7:
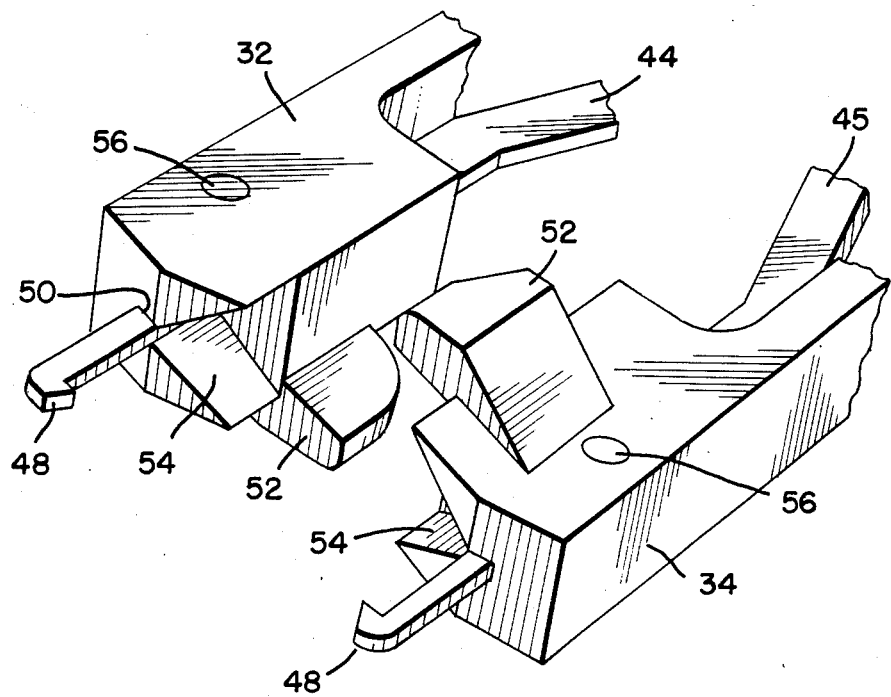
FIG. 7 is a detail perspective view of a portion of the extraction tool.

Turn now to the drawings and initially to FIGS. 1-3 which illustrate a tool 20 for extracting a microelectronic chip carrier 22 (FIGS. 4a and 4b) from a receptacle 24 to which it is connected. The chip carrier 22 may be of the type commonly referred to by the term "chipak" and the receptacle 24 may be of the type commonly referred to by the term "chipak housing". The tool 20 is self adjusting, as illustrated in FIG. 6 to accommodate a wide variety of different sizes of chip carriers. For example, as seen in FIG. 6, the tool is operable on a chipak having as few as 20 contacts to a chipak having as many as 124 contacts and it can accommodate an infinite member of sizes within that range. Of course, the inventive concept need not be so limited, but is applicable to any size of chip carrier including those having fewer than 20 contacts or more than 124 contacts.

Returning to FIGS. 1-3, the extraction tool is seen to include a left arm 26 and a right arm 28 which are pivotally mounted on a pivot pin 30 for relative movement between a widely spread condition and a narrowly spread condition. The widely spread condition is illustrated in FIG. 6 in which the tool is seen to accommodata a chip carrier 22 having 124 contacts. In the narrowly spread condition, the tool is seen to accommodate a chip carrier having only 20 contacts. Each of the arms 26 and 28 includes a tong support 32 and 34, respectively, at a working end distant from the common end as defined by the pivot pin 30 and each tong support terminates at respective surfaces 36 and 38. The tong supports 32 and 34 are actually terminal ends of flexible operative or leg members 40 and 42, respectively. The leg members 40 and 42 are composed of a suitable plastic material such as that manufactured and sold under the trademarks "DELRIN" or "LEXAN", each of which has an operative or "living" hinge 43 at a region intermediate a proximal end adjacent the pivot pin 30 and a far end at the tong supports.

Each of the arms 26 and 28 also includes a substantially rigid tong member 44 and 45, respectively, composed, for example, of spring steel, which has a near end adjacent the pivot pin 30 for movement about an axis with the leg members 40 and 42, and a distant end 46, at a terminal location, is formed with a chip carrier engaging hook 48. Each of the tong supports 32 and 34 is formed with a longitudinally extending channel 50 which slideably receives the distant end 46 of each of the tong members 44 and 45.

Both tong supports 32 and 34 include a transversely extending wing member 52 which is engageable with the chip carrier and cooperable with the hooks 48 for stabilizing the chip carrier at it is being dislodged from the receptacle 24. The wing members are suitably positioned to inhibit movement of the chip carrier 22, during the extraction process, about an axis defined by the spaced apart hooks 48. Each tong support 32 is also provided with a chip carrier receiving recess 54 appropriately sized to receive the chip carrier after it has been extracted from the receptacle. Each tong support 32 and 34 is also provided with a transversely extending metallic dowel pin 56 embedded in it and in communication with the channel 50 such that the associated tong member, 44, 45 is slideably engaged with the dowel pin.

In this manner, the construction assures that the leg members 40, 42 will freely slide within the channels 50 and will not cause undue wear of the channels.

Figure 5:
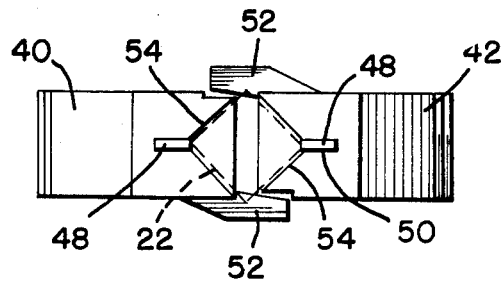
FIG. 5 is a bottom view of the extraction tool of the invention.

The operation of the extraction tool 20 will now be described. The operator of the tool opens the arms 26 and 28 to an appropriate spacing (FIG. 6) to assure that the hooks 48 are properly received in slots 58 (FIG. 5) of the receptacle 24. The bearing surfaces 36 and 38 are appropriately positioned on an upper surface 60 of the receptacle. The operator then squeezes the arms together at the intermediate region of the leg members 40 and 42, that is in the region of the hinges 43. As such squeezing is initiated, the chip carrier engaging hooks 48 are in their extended positions (see FIG. 4a) straddling the chip carrier. As force is applied to the leg members 40 and 42 by the operator to move them toward the tong members 44 and 45, the hooks 48 are moved in a continuous smooth operation longitudinally into engagement with the bottom surface of the chip carrier drawing it in a direction away from the receptacle 24, that is, in a direction substantially perpendicular to the receptacle. Simultaneously, the wing members 52 engage the upper surface of the chip carrier and prevent it from rotating or tilting about an axis defined by the hooks 48. When the legs have been moved to their inwardmost positions (FIG. 4b) the hooks 48 will have moved to a position generally coextensive of the bearing surfaces 36 and 38 of the tong supports 32 and 34, and the chip carrier 22 will be confined within the recess 54 and completely dislodged from the receptacle. The chip carrier 22 can then be fully released from the recess 54 by moving the leg member 40 and 42 to their original (FIG. 4a) positions relative to the tong members 44 and 45.

While a preferred embodiment of the invention has been disclosed in detail, it should be understood by those skilled in the art that other various modifications may be made to the illustrated embodiment without departing from the scope of the invention as described in the specification and defined in the appended claims. For example, although the disclosure has been primarily directed toward a tool for extracting a microelectronic chip carrier from a receptacle to which it is connected, the invention is intended to encompass a tool for extracting from a receptacle any object which is resistive to removal but which, without harm to the object of the receptacle, can be extracted by the application of sufficient force solely in a direction substantially perpendicular to the receptacle.

What is claimed is:

1. A tool for extracting a microelectronic chip carrier from a receptacle to which it is connected comprising:
   left and right arms pivotally mounted for relative movement on a common axis between a widely spread condition and a narrowly spread condition;
   each of said arms having a working end distant from said common axis and terminating at a bearing surface, said working ends being mutually detached;
   each of said arms including a chip carrier engaging hook at said working end selectively movable between an extended position for straddling the chip carrier when said arms are in the widely spread condition and a withdrawn position firmly engaging the chip carrier and holding it free of the receptacle when said arms are in the narrowly spread condition.

2. A tool as set forth in claim 1 wherein:
   each of said arms includes flexible operative means which, when gripped by a user and squeezed together with said arms initially in the widely spread condition and with said bearing surface engaged on the receptacle and said chip carrier engaging hooks in their extended positions straddling the chip carrier, are operable to move, in a continuing sequence, said hooks laterally toward and into engagement with the chip carrier, then said hooks longitudinally in a direction away from the receptacle until the chip carrier is dislodged from the receptacle.

3. A tool as set forth in claim 2 wherein each of said arms includes:
   a substantially rigid tong member having a near end pivotaly mounted for movement about said common axis and a distant end including said chip carrier engaging hook; and
   wherein each of said flexible operative means includes a leg member having a proximal end pivotally mounted for movement about said common axis and a far end and including a tong support adjacent said far end, said tong support having a channel to slidably receive said distant end of said tong member.

4. A tool as set forth in claim 3 wherein each of said leg members includes:
   hinge means at a region intermediate said proximal end and said far end allowing for relative lateral movement between said intermediate region and said tong member and resulting in simultaneous relative longitudinal movement between said distant end of said tong member and said associated tong support.

5. A tool as set forth in claim 3 wherein each of said tong supports defines a recess therein for receiving the chip carrier when it is dislodged from the receptacle and said hook is in the withdrawn position.

6. A tool as set forth in claim 3 wherein said tong member and said leg member of said left arm are bowed leftwardly and said tong member and said leg member of said right arm are bowed rightwardly.

7. A tool as set forth in claim 3 wherein:
   said tong supports include transversely extending wing means engageable with the chip carrier and cooperable with said hooks for stabilizing the chip carrier as it is being dislodged from the receptacle.

8. A tool as set forth in claim 7 wherein:
   said wing means are positioned to inhibit movement of the chip carrier about an axis defined by said hooks.

9. A tool as set forth in claim 3 wherein:
   said tong support includes a transversely extending metallic dowel pin embedded in said tong support and in communication with said channel whereby said associated tong is slidably engaged thereon.

10. A tool as set forth in claim 1 wherein:
    each of said arms includes flexible operative means which, when gripped by a user and squeezed together with said arms initially in the widely spread condition and with said bearing surface engaged on the receptacle and said object engaging hooks in their extended positions straddling the object, are operable to move, in a continuing sequence, said hooks laterally toward and into engagement with the object, then said hooks longitudinally in a direction away from the receptacle until the object is dislodged from the receptacle.

11. A tool for extracting a microelectronic chip carrier from a receptacle to which it is connected comprising:

a pair of substantially rigid mutually cooperating tong members, each of said tong members having a near end and a distant end and being pivotally mounted for relative movement about a common axis at said near ends, each of said tong members including a chip carrier engaging hook at said distant end;

a pair of leg members, one of said leg members being associated with one of said tong members, the other of said leg members being associated with the other of said tong members, each of said leg members having a proximal end and a far end and being pivotally mounted for relative movement on said common axis at said proximal ends, each of said leg members including a tong support adjacent said far end having a channel to slidably receive said distant end of its associated said tong and having a bearing surface at an extremity thereof;

each of said leg members including hinge means at a region intermediate said proximal end and said far end allowing for relative lateral movement between each of said intermediate regions and its associated one of said tong members and resulting in simultaneous relative longitudinal movement between said distant ends of said tongs and said associated tong supports;

whereby each of said hooks is in an extended position distant from an associated one of said bearing surfaces when said hinge means is broadly spaced from its said associated tong; and whereby each of said hooks is in a retracted position proximate to an associated one of said bearing surfaces when said hinge means is narrowly spaced from its said associated tong.

12. A tool as set forth in claim 11 including:

pin means pivotally mounting said tong members and said leg members for relative movement about said common axis;

a first arm comprising one of said tong members and its associated one of said leg members being relatively movable about said common axis relative to a second arm comprising the other of said tong members and its associated one of said leg members to adjust the lateral distance between said hooks to accommodate chip carriers of various sizes.

13. A tool as set forth in claim 12 wherein:

each of said tong supports defines a recess therein for receiving the chip carrier;

such that with said first and second arms sufficiently spaced that said hooks in their extended poritions straddle a chip carrier when said bearing surface engages the receptacle, as said arms are squeezed together, lateral movement of said leg members toward their associated said tong members is effective to move, in a continuing sequence, said hooks laterally toward and into engagement with the chip carrier, then said hooks longitudinally in a direction away from the receptacle until the chip carrier is dislodged from the receptacle and firmly held within the recess.

14. A tool for extracting from a receptacle to which it is connected an object which is resistive to removal comprising:

left and right arms pivotally mounted for relative movement on a common axis between a widely spread condition and a narrowly spread condition;

each of said arms having a working end distant from said common axis and terminating at a bearing surface, said working ends being mutually detached;

each of said arms including an object engaging hook at said working end selectively movable in a direction substantially perpendicular to a plane of the receptacle between an extended position for straddling the object when said arms are in the widely spread condition and a withdrawn position firmly engaging the object and holding it free of the receptacle when said arms are in the narrowly spread condition.

* * * * *

UNITED STATES PATENT AND TRADEMARK OFFICE
CERTIFICATE OF CORRECTION

PATENT NO. : 4,666,199

DATED : May 19, 1987

INVENTOR(S) : Cheh

It is certified that error appears in the above—identified patent and that said Letters Patent is hereby corrected as shown below:

In The Claims:

Col. 6, line 16, delete "pivotaly" and insert --pivotally--.

Col. 6, line 57, delete "Claim 1" and insert --Claim 12--.

Col. 8, line 12, delete "poritions" and insert --positions--.

Signed and Sealed this

Fifteenth Day of September, 1987

Attest:

DONALD J. QUIGG

*Attesting Officer*    *Commissioner of Patents and Trademarks*